United States Patent
Lin et al.

[11] Patent Number: 6,063,695
[45] Date of Patent: May 16, 2000

[54] SIMPLIFIED PROCESS FOR THE FABRICATION OF DEEP CLEAR LASER MARKS USING A PHOTORESIST MASK

[75] Inventors: Chung-Te Lin, Tainan, Taiwan; Chin-Hsiung Ho, Sunnyvale, Calif.; Hsueh-Liang Chiu, Hsin-Chu; So-Wein Kuo, Hsin-Chu, both of Taiwan

[73] Assignee: Taiwan Semiconductor Manufacturing Company, Hsin-Chu, Taiwan

[21] Appl. No.: 09/192,451

[22] Filed: Nov. 16, 1998

[51] Int. Cl.[7] .................................................. H01L 21/301
[52] U.S. Cl. ......................... 438/462; 438/460; 438/463; 438/940; 216/65; 216/94; 216/99; 148/DIG. 28
[58] Field of Search ..................................... 438/460, 462, 438/463, 940; 216/65, 94, 99; 148/DIG. 28

[56] References Cited

U.S. PATENT DOCUMENTS

| | | | |
|---|---|---|---|
| 4,224,101 | 9/1980 | Tijburg et al. ........................... | 156/643 |
| 5,185,295 | 2/1993 | Goto et al. ............................... | 437/226 |
| 5,329,090 | 7/1994 | Woelki et al. ...................... | 219/121.68 |
| 5,610,104 | 3/1997 | Mitchell .................................. | 437/228 |

*Primary Examiner*—John F. Niebling
*Assistant Examiner*—David A Zarneke
*Attorney, Agent, or Firm*—George O. Saile; Stephen B. Ackerman

[57] ABSTRACT

A process for the formation of deep clear laser marks on silicon wafers is described. Tall ridges of material which is erupted from the wafer surface during the deep laser penetration form adjacent to the marks. These ridges are of the order of 3 to 15 microns in height and must be removed prior to subsequent wafer processing to avoid fragmentation causing scratches and particulate contamination. The process of the invention deposits a non-conformal layer of photoresist or other flowable material on the wafer. The peaks of the ridges protrude above the surface of the conformal layer be a significant amount and are then etched away using an aqueous silicon etch. The non-conformal layer protects the wafer surface from the silicon etch so that only the ridges are removed. After the ridges are etched, the non-conformal layer is removed leaving residual ridges of a height less than or equal to the thickness of the conformal layer.

15 Claims, 4 Drawing Sheets

SIMPLIFIED PROCESS FOR THE FABRICATION OF DEEP CLEAR LASER MARKS USING A PHOTORESIST MASK

BACKGROUND OF THE INVENTION (1) Field of the Invention

The invention relates to processes for the manufacture of semiconductor devices and more particularly to processes related to the formation of laser marks on semiconductor wafers.

(2) Background of the Invention and Description of Previous Art

The fabrication of integrated circuits involves the forming of semiconductor devices within the surface of silicon wafers. The integrated circuits are located within discrete units identified as chips or dice. Each chip or die contains the devices and circuits which will constitute a discrete manufactured product. The dice are arranged in a fashion, on the wafer, to provide a maximum number of functional dice of final product. This organization is commonly identified by a wafer map.

During manufacture, the silicon wafers are subjected to a series of processing steps, some of which address multiple wafers at one time and others of which process the wafers one at a time. In order to effectively monitor the production line it is necessary to maintain a reliable system of wafer tracking. To this end laser identification marks are embedded on each wafer at the very beginning of the processing cycle. They contain information for later chip identification such as lot number and job number as well as wafer identification.

For some product designs, the laser marks are located in the saw kerf adjacent to the product dice or in an unused region near the wafer edge. This means of identification allows in-process tracking of wafers by lot and job number. In other designs laser marks are provided on the chips themselves and can later be used to relate in-the-field chip failures to processing history. Such laser marks reflect not only wafer and lot number but can also indicate die location on the wafer.

A Nd:YAG laser is typically used to produce marking on silicon wafers The laser beam is focused and pulsed in a pattern of spots creating pits of the order of 10 microns in depth. An apparatus for writing on silicon wafers with a laser is described by Woelki, et.al., U.S. Pat. No. 5,329,090. The high energy pulses cause violent local eruption of molten material from the surface of the wafer in the path of the beam. The molten material is deposited immediately adjacent to the marks forming tall ridges around the periphery of the mark. Failure to remove these ridges results in later fragmentation of the ridges causing scratches and particulate contamination. It is imperative that these ridges be significantly and controllably attenuated before proceeding with further wafer processing.

Efforts to reduce the amount of silicon slag spewed on the wafer in the vicinity of the laser mark are often directed towards minimizing the depth of laser penetration of the silicon. Mitchell, U.S. Pat No. 5,610,104 develops a mark by cutting an opening through a layer of silicon nitride or silicon oxide formed over the silicon surface and just exposing the silicon to no more than 2,000 Angstroms. The mark is then further propagated into the silicon by an oxidation. The oxide layer is then etched away.

Goto, et.al., U.S. Pat. No. 5,185,295 describes a method of dicing semiconductor substrates by laser scribing. Here, the laser cutting depth is greater than 150 to 200 microns. However, the process takes place after the integrated circuits have been completely fabricated and covered with protective layer.

Although the formation of shallow laser marks develops less slag and debris, it is usually more desirable to form deeper laser marks. Shallow laser marks are prone to obliteration during subsequent processing, for example by deposited films, and are not as clear and crisp as deeper marks. The deep laser marks addressed by this invention are of the order of 10 microns deep.

In FIG. 1 is a measurement trace showing the cross sectional profile of a deep laser mark on a silicon wafer. The trace was made just after the mark was formed with a Model P-30 SMIF (Standard Mechanical Interface) profiler manufactured by the KLA-Tencor Corporation of Milpitas, Calif. The mark is about 10 microns deep and about 60 microns wide at plane of the wafer. During the formation of the mark, molten silicon erupts in the wake of the laser beam and deposits to form ridges 14 immediately adjacent to the mark opening. The ridges 14 are essentially as high as the mark is deep.

Conventionally CMP(chemical mechanical polishing) is used for smoothing the surface topography by removing the ridges. However, this method causes the ridges to break off into fragments which become embedded in the CMP pad and cause severe scratches of the wafer surface. The fragments also become lodged on the wafer causing extensive particulate contamination.

SUMMARY OF THE INVENTION

It is an object of this invention to provide an improved method for the formation of deep and clear laser marks on silicon wafers.

It is another object of this invention to provide a method for removing silicon slag and residues, which present as ridges, resulting from the process of forming deep laser marks on substrate wafers.

It is yet another object of this invention to provide a method for preventing the contamination of the surface of a substrate wafer by particulates arising from the fragmentation of slag and other deposits formed as a result of the formation of deep laser marks in the wafer surface.

It is still another object of this invention to provide a method for preventing the formation of micro scratches and micro trenches on the surface of a substrate wafer caused by the abrasion by particulates arising from the fragmentation of slag and other deposits which occur in the form of ridges next to deep laser marks. The ridges are debris formed as a result of laser ablation of the wafer surface.

These objects are accomplished by depositing a thin non-conformal layer of a flowable material, for example, photoresist over the wafer surface after the formation of the laser marks. The deposits remaining after the laser marks are formed, protrude above the non-conformal coating. The protruding material, which comprises the greater portion of the ridges, is then removed by wet chemical etching. The non-conformal coating protects the wafer surface from the action of the etchant.

DESCRIPTION OF THE PREFERRED EMBODIMENTS

In a first embodiment of the current invention, a monocrystalline silicon wafer is provided. A deep laser mark is formed in the wafer surface by laser ablation with a programmable Nd:YAG laser. The procedure for forming laser identification marks on silicon wafers is well known and widely practiced in the art. The laser marks are embedded into the wafer before the actual processing of integrated circuits begins. The mark is made by pulsing the laser as it's beam is scanned over a region of the wafer in a pattern thereby printing identification marks for example, numbers and letters. The laser energy causes the material of the wafer surface to melt and erupt leaving an opening with the erupted material deposited alongside the opening.

Figure 1:
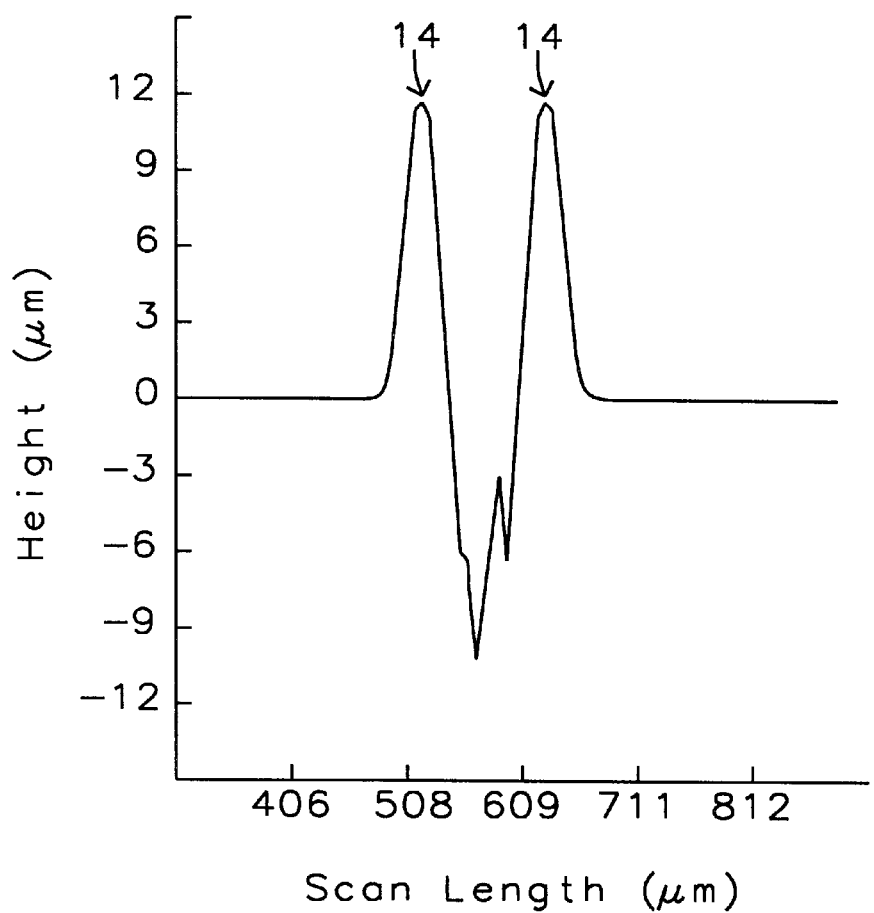
FIG. 1 is a trace of the surface profile on a silicon wafer across a freshly formed deep laser mark made with a Tencor Model P-30 SMIF profiler.
Figure 2:
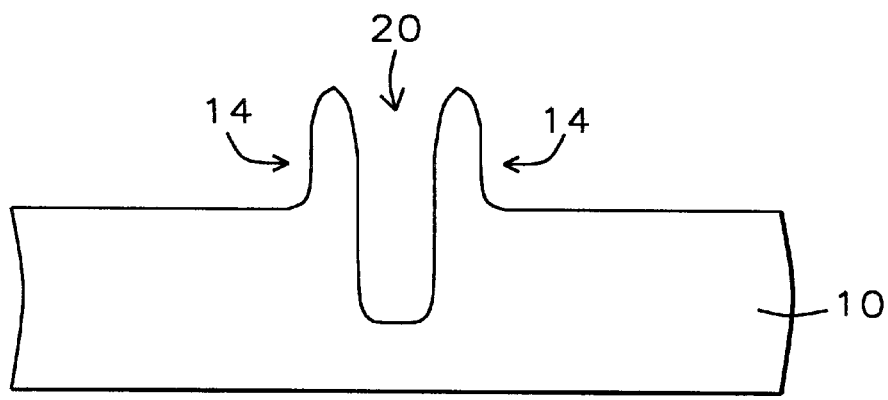
FIG. 2 is a cross section of a deep laser mark modeled after the instrument trace of the laser mark profile shown in FIG. 1 and used to illustrate the embodiments of the current invention.

A cross section of a portion of the mark 20 is shown in FIG. 2. The drawings used to illustrate the steps of the method of this invention are modeled after the measured profile trace shown in FIG. 1. The mark 20 in the current embodiment is about 10 microns deep with respect to the surface plane of the wafer 10. However, the method of the current invention is capable of being employed advantageously to marks between about 3 and 15 microns deep. The ridges 14 formed of erupted material containing primarily silicon, extend in height about 10 microns above the plane of the wafer surface.

Figure 3A:
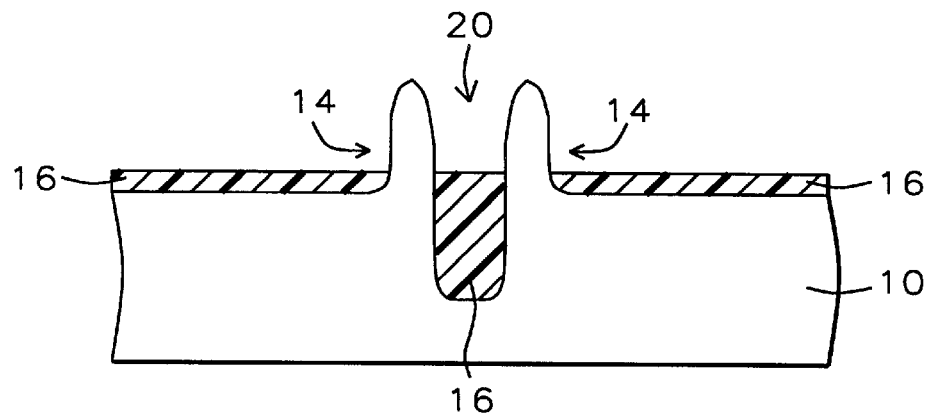
FIG. 3A through FIG. 3C are cross sectional views of a silicon wafer illustrating the process steps of a first embodiment of the current invention.

Referring now to FIG. 3A, a non-conformal layer of photoresist 16 is deposited on the wafer 10 after the deep laser marks have been formed. The photoresist coating 14 is nominally between about 1 and 3 microns thick and is deposited and cured by conventional methods well known in the art of photolithography. Because the photoresist is applied as a liquid the deposited film is non-conformal and the ridges 14 protrude above the layer 16. Photoresist is chosen for this embodiment because it is readily available to a semiconductor manufacturing facility. It is to be understood that other materials may be similarly employed to form a non-conformal layer through which the ridges 14 may protrude and be exposed. Viable alternatives to photoresist include spin-on-glasses which are often used in semiconductor manufacturing for etchback planarization. These materials are likewise applied in liquid form and can be applied as a non-conformal coating. Other resinous materials may be applied in a similar fashion.

The wafer 10 is next subjected to an aqueous silicon etchant, for example and etchant containing HF, $HNO_3$ and $CH_3COOH$. The etchant is prepared in a relatively dilute form in order to minimize attack of the photoresist. A suitable etchant may be prepared by combining 1 part by volume or thereabout of 49 weight % HF with 26 parts by volume or thereabout of 69 weight percent $HNO_3$, and 33 parts by volume or thereabout of glacial $CH_3COOH$ with 20 parts by volume or thereabout of $H_2O$.

The wafer is etched for a time period, which is experimentally determined. In the present embodiment the time period is between about 8 and 14 minutes. The protruding portions of the ridges 14 are removed by the action of the etchant. After this time period the etchant is quenched by rinsing the wafer 10 with de-ionized water.

Figure 3B:
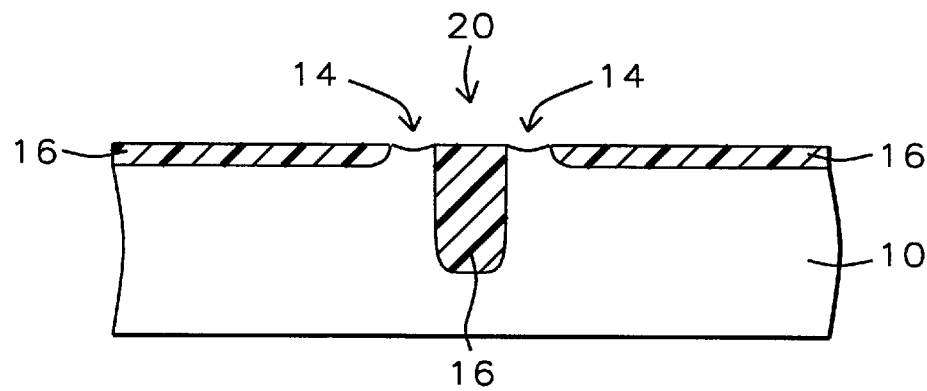

FIG. 3B shows a cross section of the laser mark after the aqueous silicon etch. The ridges 14 have been reduced in height to approximately the thickness of the photoresist layer 16. By carefully calibrating the etching procedure, it is possible to quench the etchant at a time when the ridges have receded somewhat below the surface of the photoresist, thereby achieving an optimal reduction in ridge height.

Figure 3C:
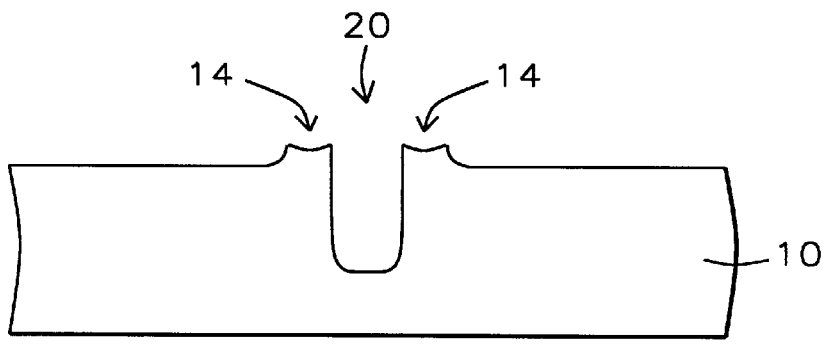

The photoresist layer is next removed either by plasma ashing or by well known liquid solvents. FIG. 3C shows the cross section of the deep laser mark 20 after the photoresist has been removed.

In a second embodiment, a conformal layer is first deposited over the wafer with freshly formed laser marks. The conformal layer offers added protection of the wafer surface to subsequently applied silicon etchants. After the conformal layer is applied a non-conformal layer is applied as in the first embodiment, exposing the conformally clad ridges above the surface of the non-conformal layer.

A monocrystalline silicon wafer is provided. A deep laser mark is formed in the wafer surface by laser ablation with a programmable Nd:YAG laser. The procedure for forming laser identification marks on silicon wafers is well known and widely practiced in the art. The mark is made by pulsing the laser as it's beam is scanned over a region of the wafer in a pattern thereby printing identification marks for example, numbers and letters. The laser energy causes the material of the wafer surface to melt and erupt leaving an opening with the erupted material deposited alongside the opening.

A cross section of a portion of the mark 20 is shown in FIG. 2. The drawings used to illustrate the steps of the method of this invention are modeled after the measured profile trace shown in FIG. 1. The mark 20 in the current embodiment is about 10 microns deep with respect to the surface plane of the wafer 10. However, the method of the current invention is capable of being employed advantageously to marks between about 3 and 15 microns deep. The ridges 14 formed of erupted material containing primarily silicon, extend in height about 10 microns above the plane of the wafer surface.

Figure 4A:
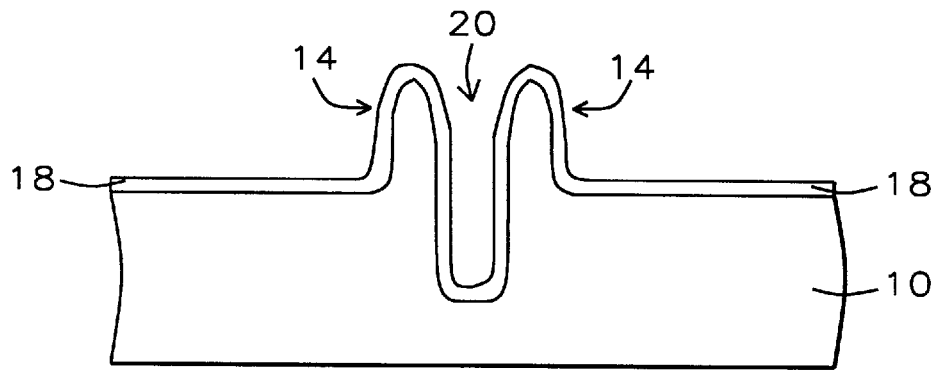
FIG. 4A through FIG. 4E are cross sectional views of a silicon wafer illustrating the process steps of a second embodiment of the current invention.

Referring now to FIG. 4A, a conformal layer of silicon nitride 18 is deposited over the wafer 10. The layer 18 is deposited by a conformal deposition method, for example by LPCVD(low pressure chemical vapor deposition). Procedures for the deposition of LPCVD silicon nitride are well known to those in the art. Alternatively, other insulative materials, for example silicon oxynitride may be conformally deposited to form the layer 18. The layer 18 offers added protection of the planar wafer surface to subsequently applied silicon etchants. Optionally, a pad oxide (not shown) about 100 Angstroms thick may be grown by well known thermal oxidation methods to buffer any mechanical stresses developed in the silicon nitride layer 18. Inclusion of a pad oxide under a silicon nitride layer is good and common practice, in particular if the wafer is subjected to high temperatures with the silicon nitride layer in place.

Figure 4B:
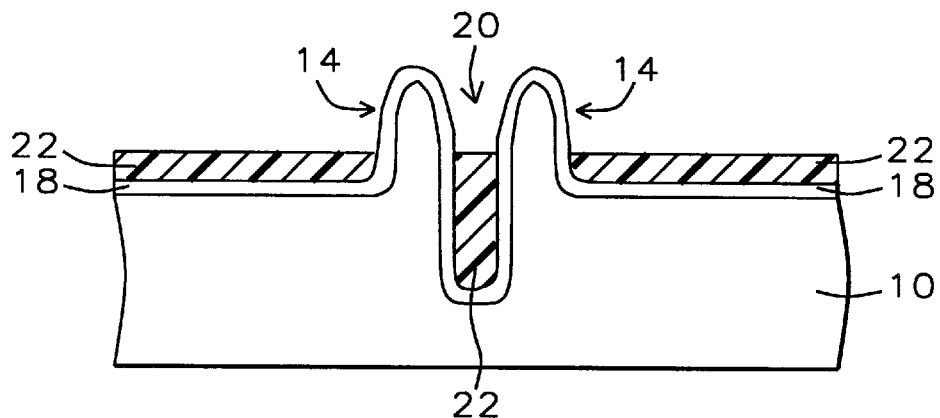

Referring now to FIG. 4B, a non-conformal layer of photoresist 22 is deposited on the wafer 10. The photoresist coating 14 is nominally between about 1 and 3 microns thick and is deposited and cured by conventional methods well known in the art of photolithography. Because the photoresist is applied as a liquid the deposited film is non-conformal and the ridges 14 with their silicon nitride coating 18 protrude above the layer 16. Photoresist is chosen for this embodiment because it is readily available to a semiconductor manufacturing facility. It is to be understood that other materials may be similarly employed to form a non-conformal layer through which the ridges 14 may protrude and be exposed. Viable alternatives to photoresist include spin-on-glasses which are often used in semiconductor manufacturing for etchback planarization. These materials are likewise applied in liquid form and can be applied as a non-conformal coating. Other resinous materials may be applied in a similar fashion.

Figure 4C:
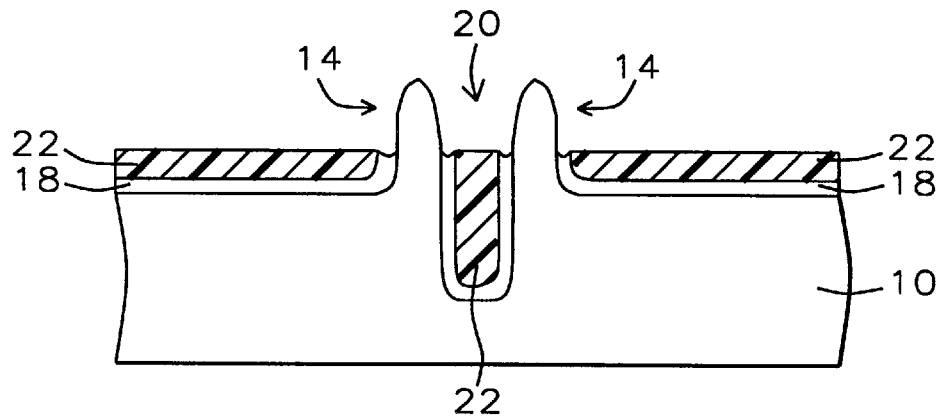

The wafer 10 is next subjected to an isotropic plasma etch wherein the silicon nitride coating 18 on the portions of the ridges protruding above the photoresist layer 22 is etched, thereby exposing the silicon ridges. Isotropic plasma etching of silicon nitride is well known and understood by those in the art. A suitable silicon nitride plasma etchant uses fluorocarbons, for example $CF_4$ in the presence of oxygen. FIG. 4C shows a cross section of the laser mark after the silicon nitride layer is plasma etched.

The wafer 10 is next subjected to an aqueous silicon etchant as in the first embodiment, for example and etchant containing HF, $HNO_3$ and $CH_3COOH$. The etchant is prepared in a relatively dilute form in order to minimize attack of the photoresist. The protruding portions of the ridges 14 are removed by the action of the etchant. A suitable etchant may be prepared by combining 1 part by volume or thereabout of 49 weight % HF with 26 parts by volume or thereabout of 69 weight percent $HNO_3$, and 33 parts by volume or thereabout of glacial $CH_3COOH$ with 20 parts by volume or thereabout of $H_2O$. The wafer is etched for a time period which is experimentally determined. In the present embodiment, the time period is between about 8 and 14 minutes. After this time period the etchant is quenched by rinsing the wafer 10 with de-ionized water.

Figure 4D:
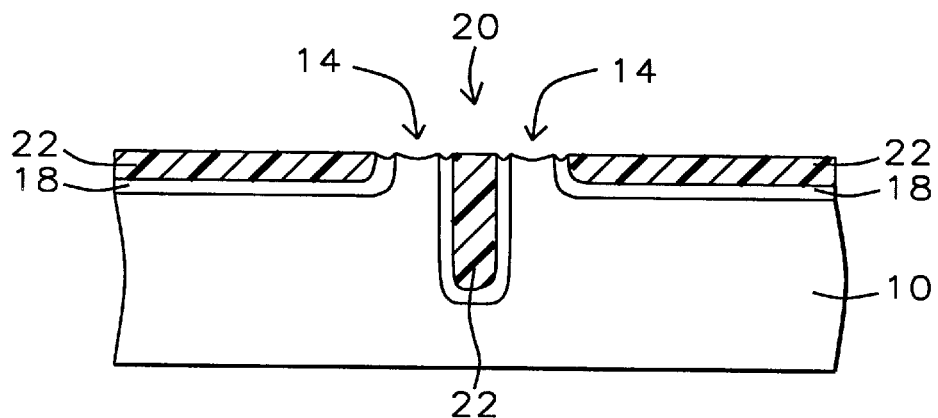

FIG. 4D shows a cross section of the laser mark 20 after the aqueous silicon etch. The ridges 14 have been reduced in height to approximately the combined thickness of the photoresist layer 16 and the silicon nitride layer 22. By carefully calibrating the etching procedure, it is possible to quench the etchant at a time when the ridges have receded somewhat below the surface of the photoresist, thereby achieving an optimal reduction in ridge height.

Figure 4E:
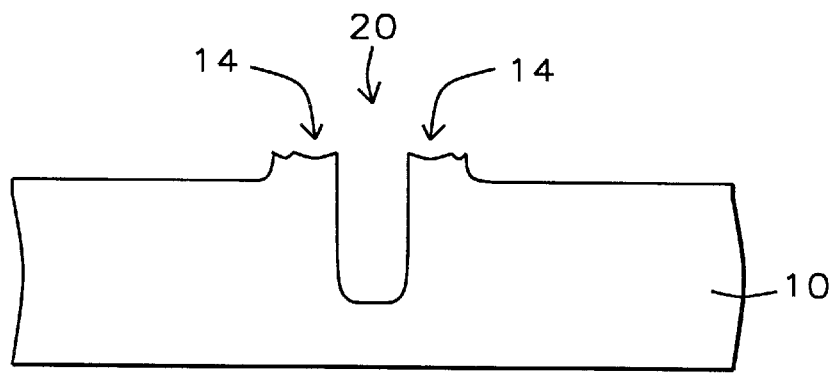

The photoresist layer is next removed either by plasma ashing or by well known liquid solvents. Finally the residual silicon nitride layer 18 is removed, preferably by wet etching in hot $H_3PO_4$, a common method for isotropically etching silicon nitride. If a pad oxide was used under the silicon nitride layer, it is removed by a dip in aqueous HF. FIG. 4E shows the cross section of the deep laser mark 20 after the photoresist and residual silicon nitride have been removed. The profile is comparable to that obtained in the first embodiment as illustrated by FIG. 3C.

The embodiments use silicon wafers. It should be well understood by those skilled in the art that other substrates may also be used and, by applying the procedures taught by this invention, the same objectives may be achieved. While the invention has been particularly shown and described with reference to the preferred embodiments thereof, it will be understood by those skilled in the art that various changes in form and details may be made without departing from the spirit and scope of the invention.

What is claimed is:

1. A method for forming a mark on a silicon wafer comprising:

(a) providing a silicon wafer;
    (b) forming a mark on said silicon wafer by writing with a laser beam whereby a ridge of material is formed on the surface of said wafer adjacent to said mark;
    (c) depositing a non-conformal layer over said silicon wafer whereby a upper portion of said ridge protrudes above the surface of said non-conformal layer;
    (d) etching said upper portion of said ridge; and
    (e) removing said non-conformal layer.

2. The method of claim 1 wherein said mark is between about 3 and 15 microns deep.

3. The method of claim 1 wherein said non-conformal layer is selected from the group consisting of photoresist, a spin-on-glass, and a curable liquid resin.

4. The method of claim 1 wherein said non-conformal layer is between about 1 and 3 microns thick.

5. The method of claim 1 wherein said upper portion of said ridge is etched in an aqueous silicon etch.

6. The method of claim 5 wherein said aqueous silicon etch comprises 1 part by volume or thereabout of 49 weight % HF with 26 parts by volume or thereabout of 69 weight percent $HNO_3$, and 33 parts by volume or thereabout of glacial $CH_3COOH$ with 20 parts by volume or thereabout of $H_2O$.

7. A method for forming a mark on a silicon wafer comprising:

(a) providing a silicon wafer;
    (b) forming a mark on said silicon wafer by writing with a laser beam whereby a ridge of material is formed on the surface of said silicon wafer next to said mark;

(c) depositing a conformal layer over said silicon wafer;

(d) depositing a non-conformal layer over said silicon wafer whereby an upper portion of said ridge protrudes above the surface of said non-conformal layer exposing a portion of said conformal layer;

(e) etching said portion of said conformal layer thereby exposing said upper portion of said ridge;

(f) etching said upper portions of said ridge;

(g) removing said non-conformal layer; and (h) removing said conformal layer.

8. The method of claim 7 wherein said mark is between about 3 and 15 microns deep.

9. The method of claim 7 wherein said non-conformal layer is selected from the group consisting of photoresist, a spin-on-glass, and a curable liquid resin.

10. The method of claim 7 wherein said non-conformal layer is between about 1 and 3 microns thick.

11. The method of claim 7 wherein said conformal layer is silicon nitride.

12. The method of claim 7 wherein said conformal layer is silicon nitride with a subjacent pad oxide.

13. The method of claim 7 wherein said conformal layer is between about 1,000 and 2,000 Angstroms thick.

14. The method of claim 7 wherein said upper portions of said ridges are etched in an aqueous silicon etch.

15. The method of claim 13 wherein said aqueous silicon etch comprises 1 part by volume or thereabout of 49 weight % HF with 26 parts by volume or thereabout of 69 weight percent $HNO_3$, and 33 parts by volume or thereabout of glacial $CH_3COOH$ with 20 parts by volume or thereabout of $H_2O$.

* * * * *